United States Patent
Chen et al.

(10) Patent No.: US 7,792,497 B2
(45) Date of Patent: Sep. 7, 2010

(54) METHOD AND APPARATUS FOR FREQUENCY SYNTHESIZING

(75) Inventors: Wei-Zen Chen, Jhubei (TW); Tai-You Lu, Jhongli (TW)

(73) Assignee: Mediatek Inc., Hsin-Chu (TW)

( * ) Notice: Subject to any disclaimer, the term of this patent is extended or adjusted under 35 U.S.C. 154(b) by 484 days.

(21) Appl. No.: 11/862,290

(22) Filed: Sep. 27, 2007

(65) Prior Publication Data

US 2008/0233914 A1 Sep. 25, 2008

Related U.S. Application Data

(60) Provisional application No. 60/896,285, filed on Mar. 22, 2007.

(51) Int. Cl.
*H04B 1/40* (2006.01)

(52) U.S. Cl. .................... 455/76; 455/112; 455/113; 455/165.1; 455/180.3; 375/215; 375/294; 375/327

(58) Field of Classification Search ............ 455/76, 455/112, 113, 165.1, 180.3, 183.1, 209, 260, 455/315, 316; 375/215, 294, 327, 376
See application file for complete search history.

(56) References Cited

U.S. PATENT DOCUMENTS

| 6,370,361 | B1* | 4/2002 | Hung et al. ............... 455/83 |
| 6,747,987 | B1* | 6/2004 | Meador et al. ............ 370/465 |
| 2004/0086057 | A1* | 5/2004 | Lee et al. ................. 375/295 |
| 2006/0183455 | A1 | 8/2006 | Cha et al. |
| 2007/0008429 | A1 | 1/2007 | Cha et al. |
| 2007/0066262 | A1 | 3/2007 | Mishra |

* cited by examiner

*Primary Examiner*—Tuan A Pham
(74) *Attorney, Agent, or Firm*—Thomas, Kayden, Horstemeyer & Risley

(57) ABSTRACT

A method and an apparatus for frequency synthesizing are provided for a wireless communication system. In a frequency synthesizer, a phase lock loop (PLL) circuit generates a first elemental frequency based on a reference frequency and a unity frequency. A first division module then divides the first elemental frequency to generate a second elemental frequency. A second division module divides the second elemental frequency a multiple of times to generate the unity frequency and a plurality of intermediate frequencies each having an exponential ratio to the unity frequency by a power of two. A second mixer is provided to mix one of the intermediate frequencies with the unity frequency to generate a step frequency, and a first mixer mixes the step frequency with one of the first and second elemental frequencies to generate an output frequency having a variety covering all frequency bands in an Ultra-Wide-Band (UWB) spectrum.

28 Claims, 6 Drawing Sheets

| Band | Ratio($f_m=16f_k$, $f_n=32f_k$, $f_k=264$MHz) | Output frequency (MHz) |
|---|---|---|
| #1 | $f_m-f_{3k}=13f_k$ | 3432 |
| #2 | $f_m-f_k=15f_k$ | 3960 |
| #3 | $f_m+f_k=17f_k$ | 4488 |
| #4 | $f_m+f_{3k}=19f_k$ | 5016 |
| #5 | $f_m+f_{5k}=21f_k$ | 5544 |
| #6 | $f_m+f_{7k}=23f_k$ | 6072 |
| #7 | $f_n-f_{7k}=25f_k$ | 6600 |
| #8 | $f_n-f_{5k}=27f_k$ | 7128 |
| #9 | $f_n-f_{3k}=29f_k$ | 7656 |
| #10 | $f_n-f_k=31f_k$ | 8184 |
| #11 | $f_n+f_k=33f_k$ | 8712 |
| #12 | $f_n+f_{3k}=35f_k$ | 9240 |
| #13 | $f_n+f_{5k}=37f_k$ | 9768 |
| #14 | $f_n+f_{7k}=39f_k$ | 10296 |

FIG. 4

METHOD AND APPARATUS FOR FREQUENCY SYNTHESIZING

BACKGROUND OF THE INVENTION

1. Field of the Invention

The invention relates to Ultra Wide Band (UWB) communications, and in particular, to a method and apparatus for frequency synthesizing.

2. Description of the Related Art

IEEE 802.15.3a is a standard for wide bandwidth and short range data communications. Orthogonal Frequency Division Multiplexing (OFDM) Ultra Wide Band (UWB) communication system is based upon the IEEE standard. UWB is defined as any radio technology having a spectrum that occupies a bandwidth greater than 20 percent of the center frequency, or bandwidth of at least 500 MHz. Modern UWB systems use modulation techniques such as OFDM to occupy these extremely wide bandwidths, thereby enabling high bit rate up to 480 Mbps within a short distance.

A UWB spectrum is shown in FIG. 1. The UWB spectrum from 3.1 to 10.6 GHz is divided into 14 bands of 528 MHz each, wherein 14 carrier frequencies are correspondingly associated. These bands are further grouped into five band groups, each having two or three consecutive bands. Conventionally, generation of the carrier frequencies involves usage of 14 independent oscillation sources. Various enhancements have been proposed to generate the carrier frequencies such as using fewer oscillation sources. For example, in Mishra's US patent publication US2007/0066262, one frequency synthesizer uses a single oscillator and a plurality of dividers to generate all 14 UWB bands. The bands are generated in two phases. In phase one, bands 2, 5, 8, 11 and 14 are first generated. In phase two, the remaining bands are generated by frequency translation of the bands 2, 5, 8, 11 and 14. In this architecture, only one oscillator source is required, however, the two phase process is deemed ineffective since generation of the bands 1, 3, 4, 6, 7, 9, 10, 12 and 13 require additional circuits to perform frequency translation, wherein multiple stages of single side band (SSB) mixers are deployed. One of the disadvantages is harmonic distortion, which worsen along multiple stages as I/Q mismatch increases. Hence, Mishra's two-phase implementation is cost ineffective while performance is degraded. Therefore, an enhancement is desirable.

BRIEF SUMMARY OF THE INVENTION

An exemplary embodiment of a frequency synthesizer is provided, and adoptable for a wireless communication system. In the frequency synthesizer, a phase lock loop (PLL) circuit generates a first elemental frequency based on a reference frequency and a unity frequency. A first division module then divides the first elemental frequency to generate a second elemental frequency. A second division module divides the second elemental frequency a multiple of times to generate the unity frequency and a plurality of intermediate frequencies each having an exponential ratio to the unity frequency by a power of two. A second mixer is provided to mix one of the intermediate frequencies with the unity frequency to generate a step frequency, and a first mixer mixes the step frequency with one of the first and second elemental frequencies to generate an output frequency having a variety covering all frequency bands in an Ultra-Wide-Band (UWB) spectrum.

The first division module comprises a first divider and a first multiplexer. The first divider divides the first elemental frequency by two to generate the second elemental frequency, and the first multiplexer selects one of the first and second elemental frequencies as an input to the first mixer for mixture with the step frequency.

The second division module comprises a plurality of dividers cascaded in series, and a second multiplexer. The dividers sequentially divides the second elemental frequency by two to output the unity frequency lastly, wherein each intermediate divider correspondingly outputs an intermediate frequency, and the second multiplexer selects one of the intermediate frequencies as an input to the second mixer for mixture with the unity frequency.

A buffer circuit is further provided to adjust gain imbalance and phase mismatch before the step frequency is output to the first mixer. Specifically, the first elemental frequency is chosen to be 32 times the unity frequency, and the second elemental frequency is 16 times the unity frequency. The variety of the output frequencies covers all bands of the UWB spectrum, 3432 MHz, 3960 MHz, 4488 MHz, 5016 MHz, 5544 MHz, 6072 MHz, 6600 MHz, 7128 MHz, 7656 MHz, 8184 MHz, 8712 MHz, 9240 MHz, 9768 MHz, and 10296 MHz.

Another embodiment provides a frequency synthesizing method implemented in the frequency synthesizer. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 4 shows a frequency table according to FIGS. 3a and 3b; and

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
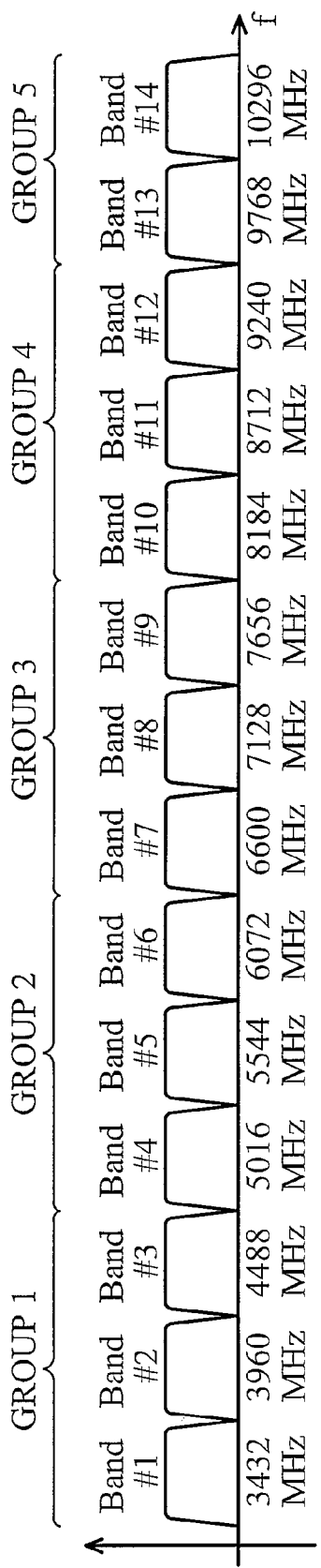
FIG. 1 is cross section of an UWB spectrum.
Figure 2:
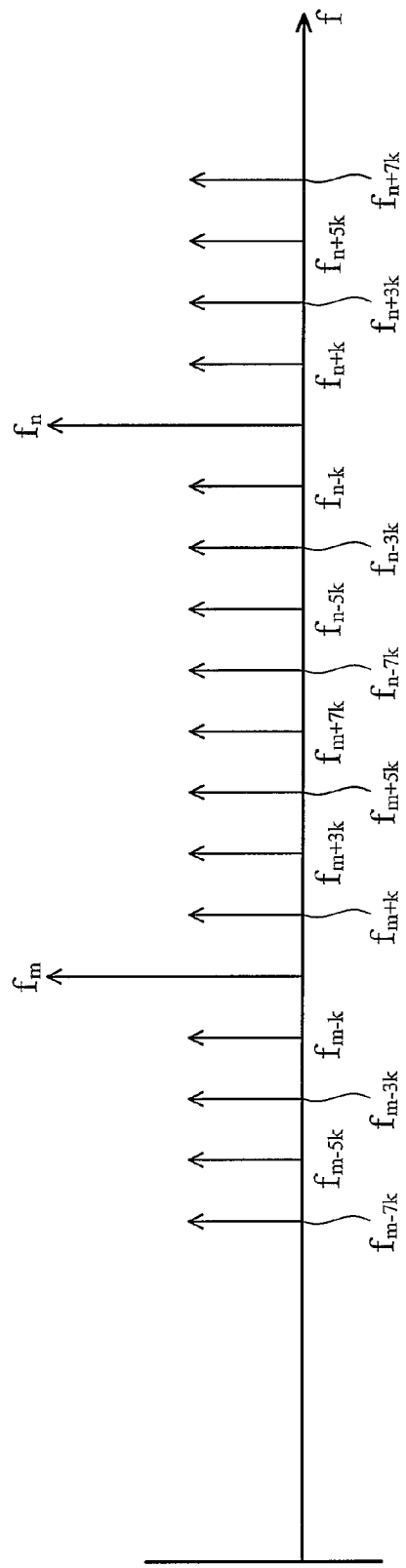
FIG. 2 shows an embodiment of combinations of two elemental frequencies and step frequencies.

FIG. 2 shows an embodiment of combinations of two elemental frequencies and step frequencies. Since the UWB spectrum comprises consecutive bands each with a width of 528 MHz, the variety can be generalized using the following formulae:

$$f_{out}=(f_n \pm f_s) \text{ or } (f_m \pm f_s) \text{ where } f_s \in \{k, 3k, 5k, 7k\} \quad (1)$$

Where $f_n$ and $f_m$ are particularly selected elemental frequencies as a basis for frequency combination, and $f_s$ is a step frequency having a variety of k, 3k, 5k and 7k where k is a unity frequency. By carefully selecting the unity frequency, combination of elemental frequencies $f_m/f_n$ and step frequencies $f_s$ generate sufficient varieties satisfying UWB bands.

Practically, formula (1) is rewritten to represent all bands in a UWB spectrum:

$$f_{out}=(4224 \pm 264x) \text{ or } (8448 \pm 264x) \text{ where } x \in \{1,3,5,7\} \quad (2)$$

Figure 3A:
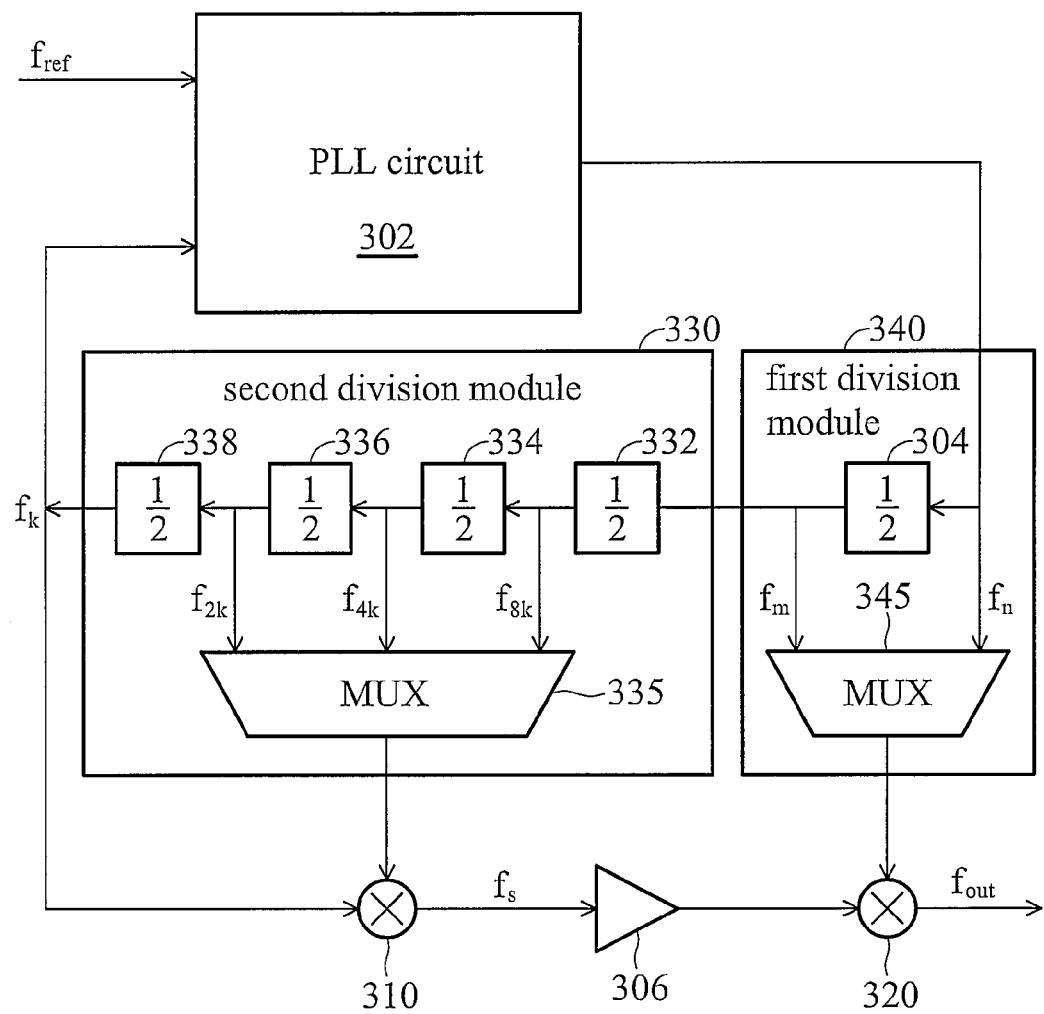
FIGS. 3a and 3b show embodiments of synthesizers according to the invention.

To implement formula (2), an embodiment of a synthesizer is shown in FIG. 3a. A PLL circuit 302 forms a loop with a first division module 340 and second division module 330, comparing a reference frequency $f_{ref}$ with a unity frequency $f_k$ fed back from the second division module 330 to generate the first elemental frequency $f_n$. The first elemental frequency $f_n$ is particularly selected to be 8448 MHz in this case, being 32 times the unity frequency $f_k$. The first division module 340 comprises a first divider 304 and a first multiplexer 345. The first divider 304 divides the first elemental frequency $f_n$ by two to generate the second elemental frequency $f_m$ of 4224 MHz. The first multiplexer 345 is coupled to input and output ends of the first divider 304, selecting one of the first and second elemental frequencies as an input to the first mixer 320 for mixture with the step frequency. In the second division module 330, four dividers 332, 334, 336 and 338 are cascaded in series, sequentially dividing the second elemental frequency $f_m$ by two to output the unity frequency $f_k$ of 264 MHz lastly. The dividers 332, 334 and 336 correspondingly output intermediate frequencies; two-times, four-times, and eight-times frequencies $f_{2k}$, $f_{4k}$ and $f_{8k}$ respective to the unity frequency $f_k$. A second multiplexer 335 is coupled to the outputs of dividers 332, 334, and 336, selecting one of the intermediate frequencies for mixture with the unity frequency in the second mixer 310. In other words, the first division module 340 provides the first and second elemental frequencies $f_n$ of 8448 MHz and $f_m$ of 4224 MHz, and the second division module 330 in cooperation with the second mixer 310 provides an adjustable step frequency comprising a variety of one-time, three-times, five-times and seven-times the unity frequency $f_k$. The step frequency $f_s$ and the output of first division module 340 are mixed in the first mixer 320, thereby effectively rendering the output frequency $f_{out}$ as defined in formula (2). In the proposed structure, the first elemental frequency $f_n$ is chosen to be 32 times the unity frequency $f_k$, so the second elemental frequency $f_m$ is 16 times the unity frequency $f_k$, and consequently, the output frequency $f_{out}$ is provided with a variety covering all 14 frequency bands in an Ultra-Wide-Band (UWB) spectrum. By selecting the reference frequency $f_{ref}$ and the PLL circuit ratio that generates the elemental frequencies $f_m$ and $f_n$, the variety can be extended to provide not only 14 frequency bands but any required combinations.

Since the step frequency $f_s$ is originated from signals passed through so many dividers and multiplexers, a buffer circuit 306 is required to prevent harmonic distortion. The buffer circuit 306 is coupled to the output of second mixer 310, adjusting gain imbalance and phase mismatch before outputting the step frequency $f_s$ to the first mixer 320. To provide further QPSK modulation, the output frequency $f_{out}$ may be provided with a quadrature phase, thus, the second mixer 310 and first mixer 320 are specifically deployed with single sideband (SSB) mixers.

In an alternative embodiment, formula (1) is rewritten to represent all bands in a UWB spectrum:

$$f_{out}=(8448\pm528x)/2 \text{ or } (16896\pm528x)/2 \text{ where } x\in\{1,3,5,7\} \quad (3)$$

Figure 3B:
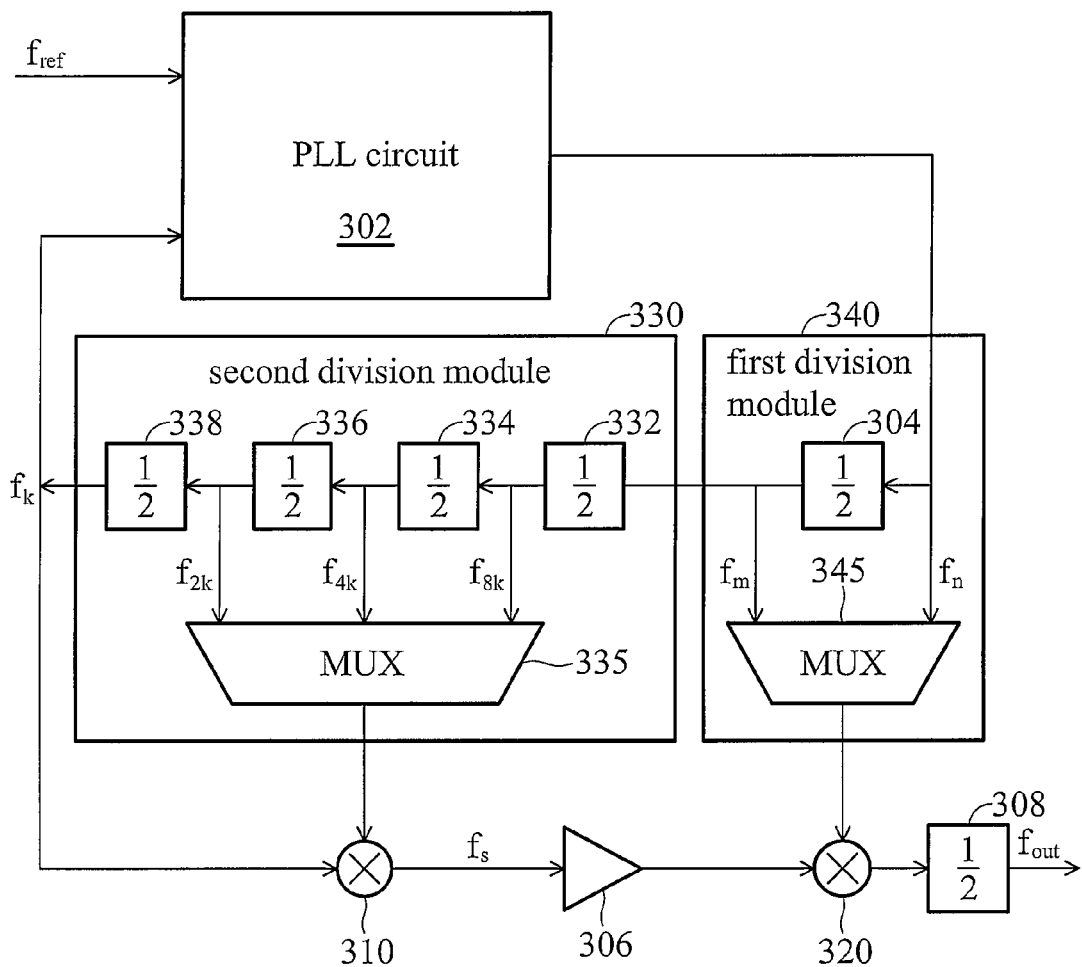

And FIG. 3b shows the embodiment implementing formula (3). In FIG. 3b, the scale of the first frequency $f_n$ is determined by the reference frequency $f_{ref}$ sent to the PLL circuit 302, which is 528 MHz in the example. The first elemental frequency $f_n$ is chosen to be 16896 MHz, hence the second elemental frequency $f_m$ is half, or 8448 MHz. Through sequential division in the second division module 330, a unity frequency $f_k$ equivalent to the reference frequency $f_{ref}$ is generated for use in the second mixer 310. The step frequency $f_s$ has a variety of 528x MHz where x is 1, 3, 5 or 7, and the first mixer 320 mixes the output from first division module 340 with the step frequency $f_s$ to obtain a variety of 8448 plus/minus 528x MHz and 16896 plus/minus 528x MHz. A second divider 308 is coupled to the output of first mixer 320, dividing the mixture result by two to generate the output frequency $f_{out}$ as shown in formula (2). Like the embodiment in FIG. 3a, the output frequency $f_{out}$ is provided with a quadrature phase by the second divider 308, and the second mixer 310 and first mixer 320 are specifically deployed with single sideband (SSB) mixers.

A frequency table is shown in FIG. 4, explaining frequency selection performed in the synthesizer of FIGS. 3a and 3b. A variety of the output frequencies covers all bands of the UWB spectrum, 3432 MHz, 3960 MHz, 4488 MHz, 5016 MHz, 5544 MHz, 6072 MHz, 6600 MHz, 7128 MHz, 7656 MHz, 8184 MHz, 8712 MHz, 9240 MHz, 9768 MHz, and 10296 MHz. It is known for those skilled in the art that a mixer can selectively perform frequency addition or subtraction by demand, so detailed operation is not introduced herein. For example, when band #1 is desired, the second elemental frequency $f_m$ is selected by the first multiplexer 345 as an input to the first mixer 320. The second multiplexer 335 then selects the two-times frequency $f_{2k}$ as an input to the second mixer 310, and accordingly, the second mixer 310 generates a three-times frequency $f_{3k}$ by combining the two-times frequency $f_{2k}$ with the unity frequency $f_k$. Thereafter, the first mixer 320 mixes the second elemental frequency $f_m$ with the three-times frequency $f_{3k}$ to generate an output frequency $(f_m-f_{3k})$, which is exactly 3432 MHz. Other frequency bands can be obtained similarly. It is noticeable that when a desired step frequency $f_s$ is equal to the unity frequency $f_k$, the output of divider 338 can be directly used by the buffer circuit 306 and first mixer 320 while the second multiplexer 335 and second mixer 310 are not required. It is shown that the combination of elemental frequencies and step frequencies is not limited to generate only 14 bands. By altering the parameters such as elemental frequencies $f_m$, $f_n$ and unity frequency $f_k$, the proposed architecture is flexibly adoptable for wide applications.

Figure 5:
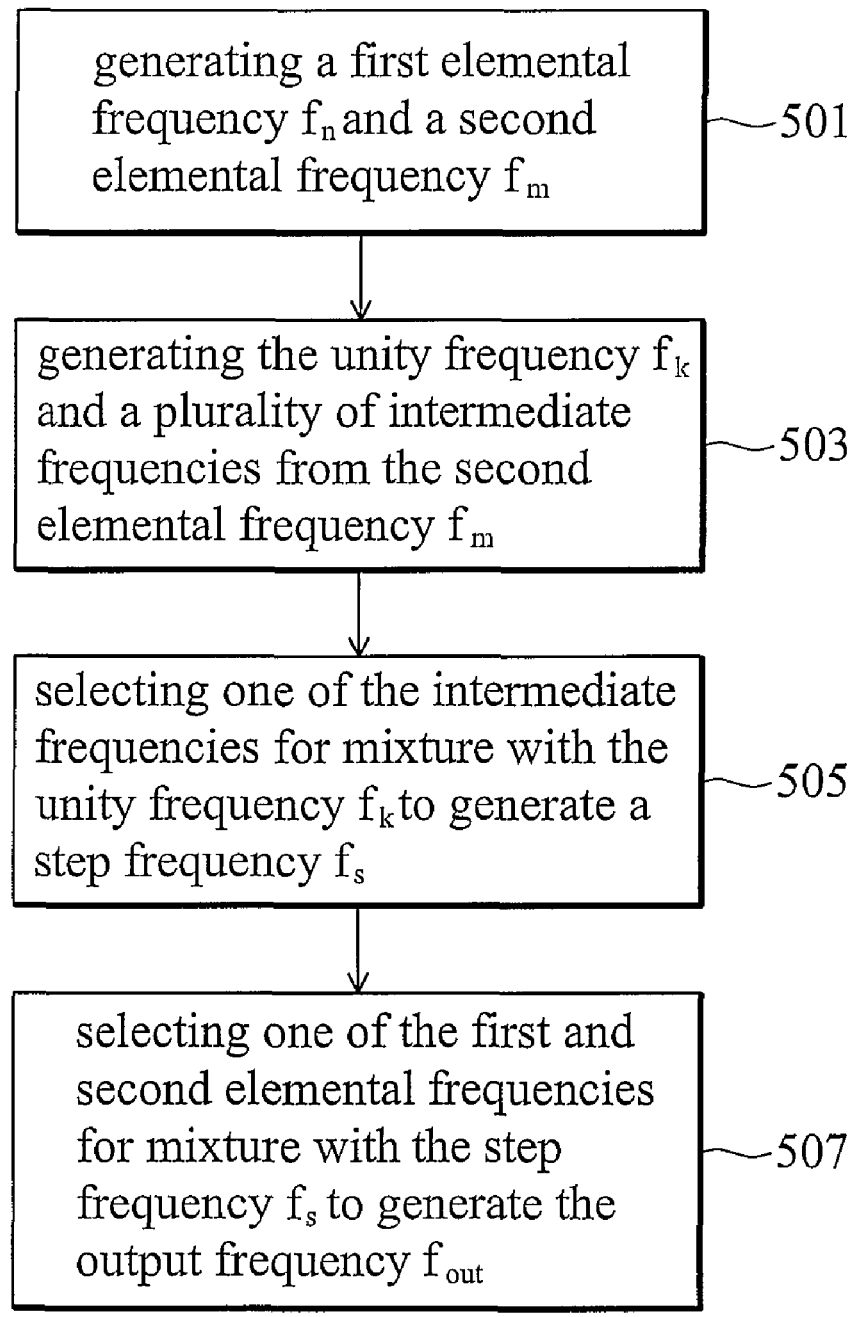
FIG. 5 is a flowchart of the synthesizing method of the invention.

A flowchart is shown in FIG. 5, in which the synthesizing method is summarized into the following steps. In step 501, a first elemental frequency $f_n$ is generated according to a reference frequency $f_{ref}$ and a unity frequency $f_k$, and a second elemental frequency $f_m$ is generated by dividing the first elemental frequency $f_n$ by two. In step 503, the second elemental frequency $f_m$ is further divided by a multiple to generate the unity frequency $f_k$ and a plurality of intermediate frequencies each having an exponential ratio to the unity frequency $f_k$ by a power of two. In step 505, one of the intermediate frequencies is selected for mixture with the unity frequency $f_k$ to generate a step frequency $f_s$. In step 507, one of the first and second elemental frequencies is selected for mixture with the step frequency $f_s$ to generate the output frequency $f_{out}$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency synthesizer for wireless communication, comprising:
    a phase lock loop (PLL) circuit, generating a first elemental frequency based on a reference frequency and a unity frequency;

a first division module, coupled to the PLL circuit, dividing the first elemental frequency to generate a second elemental frequency;
a second division module, coupled to the first division module, dividing the second elemental frequency a multiple of times to generate the unity frequency and a plurality of intermediate frequencies each having an exponential ratio to the unity frequency by a power of N;
a second mixer, coupled to the second division module, mixing one of the intermediate frequencies with the unity frequency to generate a step frequency; and
a first mixer, coupled to the second mixer and first division module, mixing the step frequency with one of the first and second elemental frequencies to generate an output frequency.

2. The frequency synthesizer as claimed in claim 1, wherein the first division module comprises:
a first divider, coupled to the PLL circuit, dividing the first elemental frequency by M to generate the second elemental frequency; and
a first multiplexer, coupled to input and output ends of the first divider, selecting one of the first and second elemental frequencies as an input to the first mixer for mixture with the step frequency.

3. The frequency synthesizer as claimed in claim 1, wherein N is two, and the second division module comprises:
a plurality of dividers cascaded in series, sequentially dividing the second elemental frequency by two to output the unity frequency lastly, wherein each intermediate divider correspondingly outputs an intermediate frequency; and
a second multiplexer, coupled to the dividers, selecting one of the intermediate frequencies as an input to the second mixer for mixture with the unity frequency.

4. The frequency synthesizer as claimed in claim 1, further comprising a buffer circuit, coupled to the output of second mixer, adjusting gain imbalance and phase mismatch before outputting the step frequency to the first mixer.

5. The frequency synthesizer as claimed in claim 1, wherein:
the first elemental frequency is 32 times the unity frequency; and
the second elemental frequency is 16 times the unity frequency.

6. The frequency synthesizer as claimed in claim 5, wherein the intermediate frequencies comprise two-times, four-times, and eight-times frequencies of the unity frequency.

7. The frequency synthesizer as claimed in claim 6, wherein:
the second multiplexer selects one of the two-times, four-times and eight-times frequencies and outputs it to the second mixer; and
the second mixer mixes the output from the second multiplexer with the unity frequency to generate the step frequency of a variety comprising one-time, three-times, five-times, and seven-times frequencies of the unity frequency.

8. The frequency synthesizer as claimed in claim 7, wherein:
the first multiplexer selects one of the first and second elemental frequencies and outputs it to the first mixer; and
the first mixer mixes the output from the first multiplexer with the step frequency to generate the output frequency of a variety comprising:
the first elemental frequency plus/minus the one-times, three-times, five-times or seven-times frequencies; and
the second elemental frequency plus/minus the one-times, three-times, five-times or seven-times frequencies.

9. A frequency synthesizing method for wireless communication, comprising:
generating a first elemental frequency based on a reference frequency and a unity frequency;
dividing the first elemental frequency by M to generate a second elemental frequency;
dividing the second elemental frequency a multiple of times to generate the unity frequency and a plurality of intermediate frequencies each having an exponential ratio to the unity frequency by a power of N;
selecting one of the intermediate frequencies for mixture with the unity frequency to generate a step frequency; and
selecting one of the first and second elemental frequencies for mixture with the step frequency to generate an output frequency.

10. The frequency synthesizing method as claimed in claim 9, further comprising adjusting gain imbalance and phase mismatch in the step frequency.

11. The frequency synthesizing method as claimed in claim 9, wherein:
the first elemental frequency is 32 times the unity frequency; and
the second elemental frequency is 16 times the unity frequency.

12. The frequency synthesizing method as claimed in claim 11, wherein the intermediate frequencies comprise a variety of two-times, four-times, and eight-times frequencies of the unity frequency.

13. The frequency synthesizing method as claimed in claim 12, wherein the step frequency comprises a variety of one-time, three-times, five-times, and seven-times frequencies of the unity frequency.

14. The frequency synthesizing method as claimed in claim 13, wherein the output frequency comprises a variety of the first elemental frequency plus/minus the one-times, three-times, five-times or seven-times frequencies, and the second elemental frequency plus/minus the one-times, three-times, five-times or seven-times frequencies.

15. The frequency synthesizer as claimed in claim 1, wherein the output frequency generated by the first mixer covers substantially all frequency bands in an Ultra-Wide-Band (UWB) spectrum.

16. The frequency synthesizer as claimed in claim 1, wherein N is two.

17. The frequency synthesizer as claimed in claim 1, wherein N is a fraction number.

18. The frequency synthesizer as claimed in claim 1, wherein N is an integer number.

19. The frequency synthesizer as claimed in claim 2, wherein M is two.

20. The frequency synthesizer as claimed in claim 2, wherein M is a fraction number.

21. The frequency synthesizer as claimed in claim 2, wherein M is an integer number.

22. The frequency synthesizing method as claimed in claim 9, wherein the output frequency covers substantially all frequency bands in an Ultra-Wide-Band (UWB) spectrum.

23. The frequency synthesizing method as claimed in claim 9, wherein N is two.

24. The frequency synthesizing method as claimed in claim 9, wherein N is a fraction number.

25. The frequency synthesizing method as claimed in claim 9, wherein N is an integer number.

26. The frequency synthesizing method as claimed in claim 9, wherein M is two.

27. The frequency synthesizing method as claimed in claim 9, wherein M is a fraction number.

28. The frequency synthesizing method as claimed in claim 9, wherein M is an integer number.

* * * * *